(12) United States Patent
Lu et al.

(10) Patent No.: US 12,095,439 B2
(45) Date of Patent: Sep. 17, 2024

(54) FILTERING CIRCUIT AND TV ANTENNA AMPLIFIER

(71) Applicant: SHENZHEN ANTOP TECHNOLOGY CO., LTD, Shenzhen (CN)

(72) Inventors: Weiming Lu, Shenzhen (CN); Ruidian Yang, Shenzhen (CN); Boliang Yang, Shenzhen (CN)

(73) Assignee: SHENZHEN ANTOP TECHNOLOGY CO., LTD, Shenzhen (CN)

( * ) Notice: Subject to any disclaimer, the term of this patent is extended or adjusted under 35 U.S.C. 154(b) by 508 days.

(21) Appl. No.: 17/405,054

(22) Filed: Aug. 18, 2021

(65) Prior Publication Data

US 2022/0385259 A1    Dec. 1, 2022

(30) Foreign Application Priority Data

May 28, 2021   (CN) .......................... 202110594333.1
May 28, 2021   (CN) .......................... 202121187686.1

(51) Int. Cl.
| | |
|---|---|
| *H03F 3/191* | (2006.01) |
| *H03F 3/19* | (2006.01) |
| *H03F 3/21* | (2006.01) |
| *H03H 7/01* | (2006.01) |
| *H04N 5/44* | (2011.01) |

(52) U.S. Cl.
CPC ............ *H03H 7/0115* (2013.01); *H03F 3/19* (2013.01); *H03F 3/21* (2013.01); *H04N 5/44* (2013.01); *H03F 2200/171* (2013.01)

(58) Field of Classification Search
CPC ............ H03H 7/0115; H03H 2250/00; H03H 7/0153; H03H 7/0161; H03H 7/03; H03H 7/1758; H03H 7/1766; H03F 3/19; H03F 3/21; H03F 2200/171; H03F 1/565; H03F 2200/451; H03F 3/191; H03F 3/68; H03F 2200/111; H03F 2200/372; H04N 5/44; H01Q 23/00
USPC ........................................................ 330/126
See application file for complete search history.

(56) References Cited

U.S. PATENT DOCUMENTS

| | | | | |
|---|---|---|---|---|
| 5,883,553 | A * | 3/1999 | Tsumura ................. | H03J 5/244 333/175 |
| 6,298,244 | B1* | 10/2001 | Boesch ..................... | H03F 3/72 455/553.1 |
| 7,245,882 | B1* | 7/2007 | McFarland .............. | H04B 1/18 455/73 |
| 9,240,811 | B2* | 1/2016 | Norholm .................. | H04B 1/56 |
| 11,764,880 | B2* | 9/2023 | Nakagawa ............... | H03F 1/56 367/135 |

* cited by examiner

*Primary Examiner* — Khanh V Nguyen
(74) *Attorney, Agent, or Firm* — SOROKER AGMON NORDMAN PTE LTD (57) ABSTRACT

The present application provides a filtering circuit and a TV antenna amplifier, the filtering circuit includes a switching module, and the switching module includes a control unit and at least two filtering units. The present application switchably render one of the at least two filtering units conductive through the control unit, and filter the signals of different frequencies in the input signals through the at least two filtering units, so that different filtering units can be switched according to the filtering requirements of the frequency signal in different regions, which makes it a wide application range.

17 Claims, 6 Drawing Sheets

FILTERING CIRCUIT AND TV ANTENNA AMPLIFIER

CROSS REFERENCE TO RELATED APPLICATION

The present application claims priorities of Chinese patent applications, with Application No. 202110594333.1, filed on May 28, 2021, and entitled "FILTERING CIRCUIT AND TV ANTENNA AMPLIFIER" and Application No. 202121187686.1, filed on May 28, 2021, and entitled "FILTERING CIRCUIT AND TV ANTENNA AMPLIFIER", the entire content of which is incorporated herein by reference.

TECHNICAL FIELD

The present application relates to the technical field of signal processing, and more particularly to a filtering circuit and a TV antenna amplifier.

BACKGROUND

Antenna is a component that transforms the guided waves propagating on a transmission line into electromagnetic waves propagating in an unbounded medium (usually free space), or making an opposite transformation, and is used in radio devices to transmit or receive electromagnetic waves. Radio communication, radio, TV, radar, navigation, electronic confrontation, remote sensing, radio astronomy and other engineering systems, all those use electromagnetic waves to transmit information, rely on the antenna to work, the general antenna will be equipped with an antenna amplifier.

Antenna amplifier is an ultra-high frequency, broadband, low noise amplifier between antenna and feeder, usually used to filter interference signals and enhance weaker signals received, thus improve the reception quality of information. However, the current filtering circuit inside the antenna amplifier can generally filter rarely one frequency of a variety of interference signals, the fact that it can only filter a single signal made it a narrow application range.

SUMMARY

An object of the present application to provide a filtering circuit, which aims at solving the problem that the traditional filtering circuit can only filter a single interference frequency.

To achieve the above object, in a first aspect, the embodiment of the present application provides a filtering circuit, which includes a switching module, the switching module includes a control unit and at least two filtering units; the at least two filtering units are configured to filter the signals of different frequencies in an input signal respectively; the control unit is configured to switchably render one of the at least two filtering units conductive, and the remaining filtering unit non-conductive.

In a possible embodiment of the first aspect, the at least two filtering units are connected in parallel, the control unit includes a switch and a PIN diode, the switch is configured to switch a power to connect to one of the at least two filtering units, and an input end and an output end of each filtering unit are connect to the positive pole of one PIN diode respectively.

In another possible embodiment of the first aspect, the filtering unit includes a first capacitor and a first inductor, at least one resonance unit and a second inductor, the first inductor, the at least one resonance unit and the second inductor being connected in series; one end of the first capacitor is connected to one end of the resonance unit, the other end of the first capacitor is connected to ground.

In another possible embodiment of the first aspect, the resonance unit includes a third inductor, a second capacitor and a third capacitor; the third inductor and the second capacitor are connected in parallel, one end of the third capacitor is connected to one end of the second capacitor, the other end of the third capacitor is connected to ground.

In another possible embodiment of the first aspect, the at least two filtering units include a 4G filtering unit and a 5G filtering unit; the 4G filtering unit is configured to filter the 4G mobile communication signal in an input signal; the 5G filtering unit is configured to filter the 5G mobile communication signal in an input signal; the control unit is configured to switchably render the 4G filtering unit or the 5G filtering unit conductive;

the input signal is a terrestrial television signal, and the filtering circuit further includes a high-pass filtering module; an output end of the high-pass filtering module is connected to an input end of the switching module, the high-pass filtering module is configured to allow an ultra-high frequency signal, or a very-high frequency signal and an ultra-high frequency signal in the terrestrial television signal to be passed through.

In another possible embodiment of the first aspect, the high-pass filtering module includes multiple sets of filter components connected in series and a fourth capacitor; the filter component includes a fourth inductor, a fifth capacitor and a sixth capacitor; one end of the fifth capacitor is an input end of the filter component, the other end of the fifth capacitor is connected to one end of the fourth capacitor, and the other end of the fifth capacitor is an output end of the filter component, the other end of the fourth capacitor is connected to the sixth capacitor in series and then connected to ground.

In another possible embodiment of the first aspect, the filtering circuit further includes an amplification module; an input end of the amplification module is connected to an output end of the switching module, And the amplification module is configured to amplify the singles filtered by the switching module.

In another possible embodiment of the first aspect, wherein the filtering circuit further includes a signal Strength adjustment module; an output end of the signal strength adjustment module is connected to an input end of the switching module, and the signal strength adjustment module is configured to adjust strength of an input signal.

In another possible embodiment of the first aspect, the signal strength adjustment module includes an adjustable resistor and a resistor; a fixed end of the adjustable resistor is connected to the resistor in series and then connected to ground, a sliding end of the adjustable resistor is connected to an input end of the switching module.

In a second aspect, the embodiment of the present application provides a TV antenna amplifier, including the aforesaid filtering circuit.

The present application has the following technical effects in comparison with the prior art: the aforesaid filtering circuit switchably render one of the at least two filtering units conductive through the control unit, and filter the signals of different frequencies in the input signals through the at least two filtering units, so that different filtering units can be switched according to the filtering requirements of the frequency signal in different regions, which makes it a wide application range.

DESCRIPTION OF TIM DRAWINGS

In order to more clearly illustrate the technical solutions in the embodiments of the present application, the drawings used in the embodiments or the prior art description will be briefly described hereinbelow Obviously, the drawings in the following description are only some embodiments of the present application. Other drawings may be obtained from those having ordinary skill in the art without departing from the scope of the present application.

FIG. $ is a signal waveform diagram when a 5G frequency is filtered by a filtering circuit provided by embodiments of the present application.

In the Figures, reference numerals are as follows: 1-Switching module, 11-Control unit, 12-filtering unit. 2-High-pass filtering module, 3-Amplification module, 4-Signal strength adjustment module.

DETAILED DESCRIPTION OF THE EMBODIMENTS

In order to make the purposes, technical solutions, and advantages of the present application clearer and more understandable, the present application will be further described in detail hereinafter with reference to the accompanying drawings and embodiments. It should be understood that the embodiments described herein are only intended to illustrate but not to limit the present application.

It should be noted that when an element is described as "fixed" or "arranged" on/at another element, it means that the element can be directly or indirectly fixed or arranged on/at another element. When an element is described as "connected" to/with another element, it means that the element can be directly or indirectly connected with/with another element.

It should be understood that terms "length", "width", "upper", "lower", "front", "rear", "left", "right", "vertical", "horizontal", "top". "bottom", "inside", "outside" and the like indicating orientation or positional relationship are based on the orientation or the positional relationship shown in the drawings, and are merely for facilitating and simplifying the description of the present application, rather than indicating or implying that a device or component must have a particular orientation, or be configured or operated in a particular orientation, and thus should not be construed as limiting the application.

Moreover, the terms "first" and "second" are adopted for descriptive purposes only and are not to be construed as indicating or implying a relative importance or implicitly indicating the number of technical features indicated. Thus, features prefixed by "first" and "second" will explicitly or implicitly represent that one or more of the referred technical features is included. In the description of the present application, the meaning of "a plurality of" or "multiple" is two or more unless otherwise specifically defined.

At the signal reception terminal of the TV antenna, it can often receive the terrestrial television signal and the mobile communication signal of the mobile phone, but the TV antenna generally only needs the terrestrial television signal, while the mobile communication signal of the mobile phone is the interference signal. The IV antenna amplifier of the traditional antenna can only filter one of the mobile communication signal, the fact that it can only filter a single signal made it a narrow application range, and it will lose its effect of signal filtering when the local frequency signal changes or the geographical location of the TV antenna amplifier is changed.

Thus, the present application provides a filtering circuit that integrates at least two filtering units to filter different frequency signals, and realizes the filtering of different frequency signals in the input signal of the TV antenna by switching different filtering units through the control unit. Therefore, according to the local actual needs, different filtering units can be selected to filter the frequency signals with the greatest interference, which can avoid the mutual interference between the terrestrial television signal and the mobile communication signal received by the TV, improving the actual reception effect of the TV, and taking into account the filtering needs of frequency signals in different regions, and having a wide application range.

Figure 1:
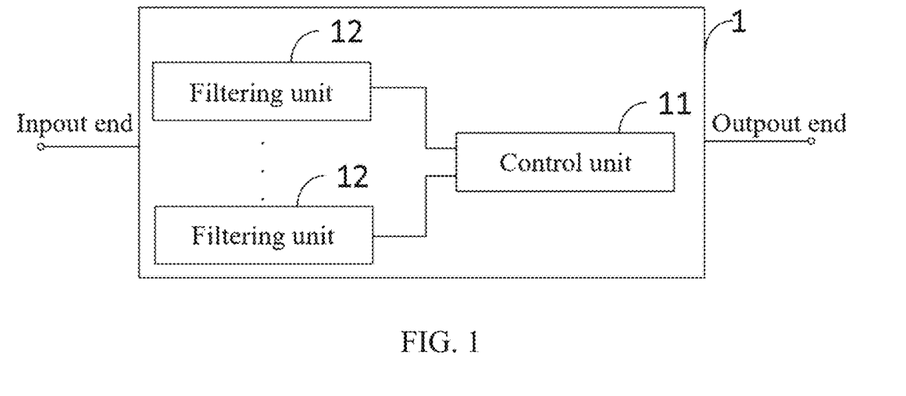
FIG. 1 is a structural schematic diagram of a switching module of the filtering circuit provided by embodiments of the present application.

FIG. 1 is a structural schematic diagram of the filtering circuit provided in the first embodiment of the present application. As shown in FIG. 1, and, for easy illustration, only portions related to the present embodiment are shown. The present application shows a filtering circuit, including a switching module 1, the switching module 1 includes a control unit 11 and at least two filtering units 12; the at least two filtering units 12 are configured to filter the signals of different frequencies in an input signal respectively; the control unit is configured to switchably render one of the at least two filtering units 12 conductive, and the remaining filtering unit 12 non-conductive.

In the embodiment of the present application, the control unit 11 only render one of the at least two filtering units 12 conductive at a time to filter the signal of one frequency in the input signal, so that the control unit 11 can freely switch the conduction of different filtering units 12 to filter the signals of different frequencies in the input signal respectively, debugging separately and without interference with each other.

Exemplarily, when the mobile communication signal in the filtering circuit application region is mainly the mobile communication signal of the 4th-Generation Mobile Communication Technology (4G) and the 5th-Generation Mobile Communication Technology (5G), the at least two filtering units 12 may include a 4G filtering unit and a 5G filtering unit; the 4G filtering unit is configured to filter the 4G mobile communication signal in the input signal; the 5G filtering unit is configured to filter the 5G mobile communication signal in the input signal; the control unit is configured to switchably render the 4G filtering unit or the 5G filtering unit conductive.

In the embodiment of the present application, the control unit switches the conduction of 4G filtering unit or 5G filtering unit according to the need that the region needs to filter the 4G mobile communication signal or 5G mobile communication signal, thus to filter the 4G frequency or 5G frequency in the input terrestrial television signal, so that the mutual interference between the TV signal and the mobile communication signal of the mobile phone is avoided, and the actual reception effect of the TV is improved. Wherein, the terrestrial television signal can include the terrestrial digital TV signal and the terrestrial analog TV signal.

Exemplarily, the at least two filtering units 12 are connected in parallel, the control unit 11 includes a switch and a PIN diode, the switch is configured to switch a power to connect to one of the at least two filtering units 12, and an input end and an output end of each filtering unit 12 are connect to the positive pole of one PLN diode respectively.

In the embodiment of the present application, the input end and the output end of each filtering unit 12 are connected to a positive pole of one PIN diode respectively, that is, each filtering unit 12 connects two PLN diodes. With the characteristics of good when conducting and thoroughness when cutting off for PIN diode, one filtering unit 12 corresponding to the two PIN diodes is completely conducted, and the other filtering unit 12 is completely turned off. The signal insertion loss is small and the isolation effect is good.

In the embodiment of the present application, the at least two filtering units 12 may include two or more. When the at least two filtering units 12 include more than two, just needing to add the corresponding PIN diode and filtering unit 12 and adjusting the switch to a corresponding number of segment switches, such as three-section, four-section switches etc., and conducting only one of the filtering units 12 at each time.

Wherein, the PIN diode is specifically is: a P-I-N structure diode by adding a thin layer of low doped intrinsic semiconductor layer between the P and N semiconductor materials of the ordinary diode. The PIN diode is widely used from low frequency to high frequency, and is mainly used in the field of radio frequency (Radio Frequency, RF), as an RF switch and RF protection circuit.

Figure 2A:
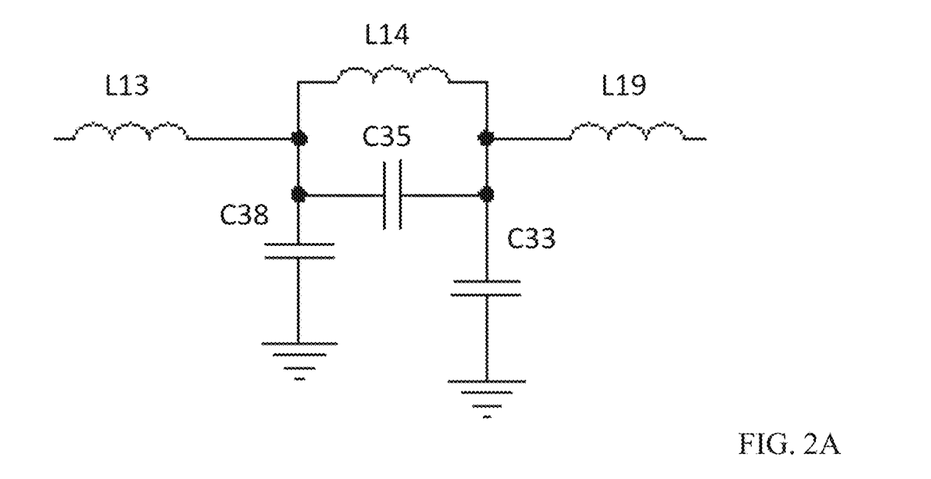
FIG. 2A and FIG. 2B are circuit schematic diagrams of two kinds of filtering units of a filtering circuit provided by embodiments of the present application.
Figure 2B:
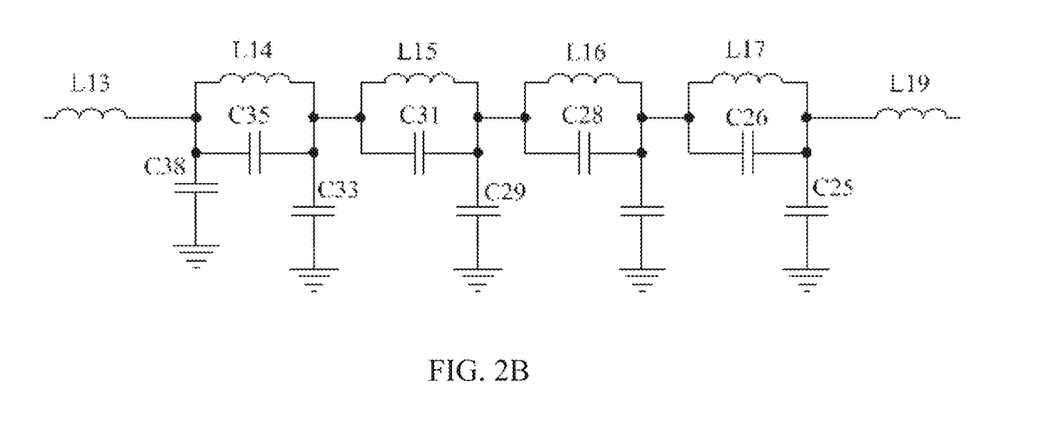

Exemplarily, FIG. 2A-FIG. 2B is a schematic diagram of the filtering unit of the filtering circuit provided in the embodiment of the present application. Different filtering units may be selected for different input signals. In the circuit provided by the present application, the filtering unit 12 may include a first capacitor and a first inductor, at least one resonance Unit and a second inductor, the first inductor, the at least one resonance unit and the second inductor being connected in series; one end of the first capacitor is connected to one end of the resonance unit, the other end of the first capacitor is connected to ground.

Exemplarily, as shown in FIG. 2A, the filtering unit 12 may include: one end of the inductor Ll3 is connected to one end of the inductor L14, one end of the capacitor C35 and one end of the capacitor C38. The other end of the inductor L14, the other end of the capacitor C35 and the other end of the capacitor C33 are common connected to one end of inductor L19, the other end of the capacitor C38 and the other end of the capacitor C33 are common connected to ground. Wherein, capacitor C38 is the first capacitor, inductor L13 is the first inductor, inductor L19 is the first inductor, inductor L14, capacitor C35, capacitor C33 is the resonance unit.

Exemplarily, as shown in FIG. 2B, the filtering unit 12 may include: the inductor L13, the inductor Ll4, the inductor L15, the inductor L16, the inductor L17 and the inductor L19 are connected in sequence, the capacitor C35 is connected in parallel at the both ends of the inductor L13, the capacitor C31 is connected in parallel at the both ends of the inductor L15, the capacitor C28 is connected in parallel at the both ends of the inductor L16, the capacitor C26 is connected in parallel at the both ends of the inductor L17, one end of the capacitor C38 is connected to the common connection of the inductor L13 and the inductor L14, one end of the capacitor C33 is connected to the common connection of the capacitor C35 and the capacitor C31, one end of the capacitor C29 is connected to the common connection of the capacitor C31 and the capacitor C28, one end of the capacitor C27 is connected to the common connection of the capacitor C28 and the capacitor C26, one end of the capacitor C25 is connected to the common connection of the capacitor C26 and the inductor L19, the other end of the capacitor C38, the other end of the capacitor C33, the other end of the capacitor C29, the other end of the capacitor C27 and the other end of the capacitor C25 are common connected to ground. Wherein, the capacitor C38 is the first capacitor, the inductor L13 is the first inductor, the inductor L19 is the first inductor, (the inductor L14, the capacitor C35, the capacitor C33), (the inductor L15, the capacitor C31, the capacitor C29), (the inductor L16, the capacitor C28, the capacitor C27), (the inductor L17, the capacitor C26, the capacitor C25) are all the resonant units.

Exemplarily, the filtering unit 12 may include at least two series capacitors.

Exemplarily, take two filtering units 12 as example. In the circuit provided in the present application, the filtering unit 12 may include the thirteenth inductor L13, the fourteenth inductor L14, the fifteenth inductor L15, the sixteenth inductor L16, the seventeenth inductor L17 and the nineteenth inductor L19, and the nineteenth resistor R19 in the control unit 11 is connected to the fourteenth inductor L14, the thirteenth inductor L13 and the positive pole of the third PIN diode D3 in sequence, and the nineteenth resistor R19 is connected to the fifteenth inductor L15, the sixteenth inductor L16, the seventeenth inductor L17 and the nineteenth inductor L19 and the positive pole of the fifth PLN diode D5 in sequence.

The common connection of the fourteenth inductor L14 and the thirteenth inductor L13 is connected to one end of the thirty-fifth capacitor C35 and one end of the thirty-eighth capacitor C38, and the common connection of the fourteenth inductor L14 and the fifteenth capacitor C15 is connected to the other end of the thirty-fifth capacitor C35, one end of the thirty-third capacitor C33 and one end of the thirty-first capacitor C31, and the common connection of the fifteenth inductor L15 and the sixteenth inductor L16 is connected to the other end of the thirty-first capacitor C31, one end of the twenty-ninth capacitor C29 and one end of the twenty-eighth capacitor C28, and the common connection of the sixteenth inductor L16 and the seventeenth inductor L17 is connected to the other end of the twenty-eighth capacitor C28, one end of the twenty-seventh capacitor C27 and one end of the twenty-sixth capacitor C26, and the common connection of the seventeenth inductor L17 and the nineteenth inductor L19 is connected to the other end of the twenty-sixth capacitor C26 and one end of the twenty-fifth capacitor C25, and the other end of the thirty-eighth capacitor C38, the other end of the thirty-third capacitor C33, the other end of the twenty-ninth capacitor C29, the other end of the twenty-seventh capacitor C27, and the other end of the twenty-fifth capacitor C25 are all connected to ground, which has a good filtering effect.

In the circuit provided in the present application, the filtering unit 12 may include the twenty-seventh inductor L27, the twenty-sixth inductor L26, the twenty-fifth inductor L25, the twenty-fourth inductor L24, the twenty-eighth inductor L28 and the twenty-ninth inductor L29, and the twenty-third resistor R23 in the control unit 11 is connected to the twenty-seventh inductor L27, the twenty-sixth inductor L26, the twenty-fifth inductor L25, the twenty-fourth inductor L24 and the positive pole of the fourth PIN diode D4 in sequence, and the twenty-third resistor R23 is connected to the twenty-eighth inductor L28, the twenty-ninth inductor L29 and the positive pole of the sixth PIN diode D6 in sequence.

The common connection of the twenty-fourth inductor L24 and the twenty-fifth inductor L25 is connected to one end of the fifty-fifth capacitor C55 and one end of the fifty-sixth capacitor C56, and the common connection of the twenty-fifth inductor L25 and the twenty-sixth inductor C26 is connected to the other end of the fifty-sixth capacitor C56, one end of the fifty-seventh capacitor C57 and one end of the fifty-eighth capacitor C58, and the common connection of the twenty-sixth inductor L26 and the twenty-seventh inductor L27 is connected to the other end of the fifty-eighth capacitor C58, one end of the fifty-ninth capacitor C59 and one end of the sixtieth capacitor C60, and the common connection of the twenty-seventh inductor L27 and the twenty-eighth inductor L28 is connected to the other end of the sixtieth capacitor. C60, one end of the sixty-first capacitor C61 and one end of the sixty-second capacitor C62, and the common connection of the twenty-eighth inductor L28 and the twenty-ninth inductor L29 is connected to the other end of the sixty-second capacitor C62 and one end of the sixty-third capacitor C63, and the other end of the fifty-fifth capacitor C55, the other end of the fifty-seventh capacitor C57, the other end of the fifty-ninth capacitor C59, the other end of the sixty-first capacitor C61, and the other end of the sixty-third capacitor C63 are all connected to ground, which has a good filtering effect.

Figure 3:
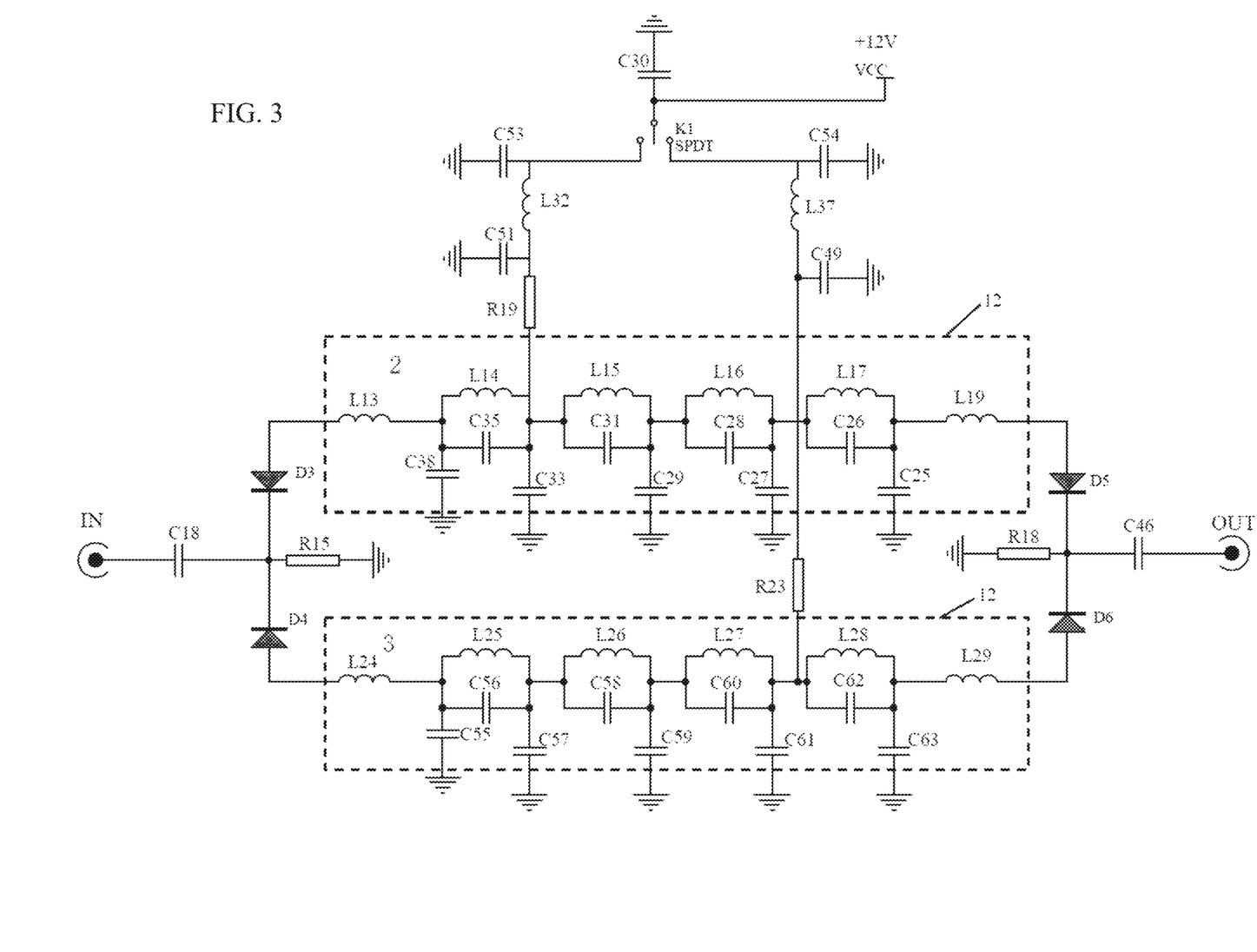
FIG. 3 is a circuit schematic diagram of a switching module of a filtering circuit provided by embodiments of the present application.

Based on the filtering unit 12 as shown in FIG. 2B, FIG. 3 is a circuit schematic diagram of the switching module of the filtering circuit provided in the embodiment of the present application. As shown in FIG. 3, exemplarily, the control unit 11 may include a switch K1 and a third PIN diode D3, a fourth PIN diode D4, a fifth PIN diode D5 and a sixth. PIN diode D6, and the first pin of the switch K1 is connected to one end of the thirtieth capacitor C30 and the power supply VCC, and the second pin of the switch K1 is connected to one end of the fifty-third capacitor C53 and one end of the thirty-second inductor L32, and the other end of the thirty-second inductor L32 is connected to one end of the fifty-first capacitor C51 and one end of the nineteenth resistor R19, and the other end of the nineteenth resistor R19 is connected to the filtering unit 12, and the other end of the thirtieth capacitor C30, the other end of the fifty-third capacitor C53 and the other end of the fifty-first capacitor C51 are all connected to wound; the third pin of the switch K1 is connected to one end of the fifty-fourth capacitor C54 and one end of the thirty-seventh inductor L37, and the other end of the thirty-seventh inductor L37 is connected to one end of the forty-ninth capacitor C49 and one end of the twenty-third resistor R23, and the other end of the resistor R23 is connected to the filtering unit 12, and the other end of the fifty-fourth capacitor C54 and the other end of the forty-ninth capacitor C49 are both connected to ground.

Exemplarily, the positive pole of the third PIN diode D3 is connected to the input end of the filtering unit 12, and the negative pole of the third PIN diode D3 is connected to one end of the eighteenth capacitor C18 and one end of the fifteenth resistor R15, and the other end of the eighteenth capacitor C18 is connected to the input signal, and the other end of the fifteenth resistor R15 is connected to ground; the positive pole of the fifth PIN diode D5 is connected to the output end of the filtering unit 12, and the negative pole of the fifth PLN diode D5 is connected to one end of the forty-sixth capacitor C46 and the eighteenth resistor R18, and the other end of the eighteenth resistor R18, and the other end of the fort-sixth capacitor C46 is connected to the output signal.

The positive pole of the fourth PLN diode D4 is connected to the input end of the filtering unit 12, and the negative pole of the fourth PIN diode D4 is connected to the common connection the eighteenth capacitor C18 and the fifteenth resistor R15, and the positive pole of the sixth PIN diode D6 is connected to the output end of the filtering unit 12, and the negative pole of the sixth PIN diode D6 is connected to the common connection of the forty-sixth capacitor C46 and the eighteenth resistor R18.

In the embodiment of the present application, when the switch K1 is connected to the second pin, the current flows from the nineteenth resistor R19 through the thirteenth inductor L13, the fourteenth inductor L14, the fifteenth inductor L15, the sixteenth inductor L16, the seventeenth inductor L17 and the nineteenth inductor L19, and then flows through the third PIN diode D3 and the fifth PIN diode D5 respectively, which makes the third PIN diode D3 and the fifth PIN diode D5 conducted, while the fourth PIN diode D4 and the sixth PIN diode D6 is not conducted at the same time. After passing through the above circuit, the signal above 790 MHz frequency is filtered.

When the switch K1 is switched to connect to the third pin, the current flows from the twenty-third resistor R23 through the twenty-seventh inductor L27, the twenty-sixth inductor L26, the twenty-fifth inductor L25, the twenty-fourth inductor L24, the twenty-eighth inductor L28 and the twenty-ninth inductor L29, and then flows through the fourth PIN diode 134 and the sixth PLN diode D6 respectively, which makes the fourth PIN diode D4 and the sixth PIN diode D6 conducted, while the fourth PIN diode D4 and the sixth. PIN diode D6 is not conducted at the same time. After passing through the above circuit, the signal above 694 MHz frequency is filtered, and the signal after filtering is outputted into low noise amplification module 6 via the forty-sixth capacitor C46.

In the embodiment of the present application, the control unit 11 may further be realized by using a multi-switching assembly or a intelligent controller, and the intelligent controller can be automatically switched according to the detection result of the mobile communication signal in the actual input signal.

Figure 4:
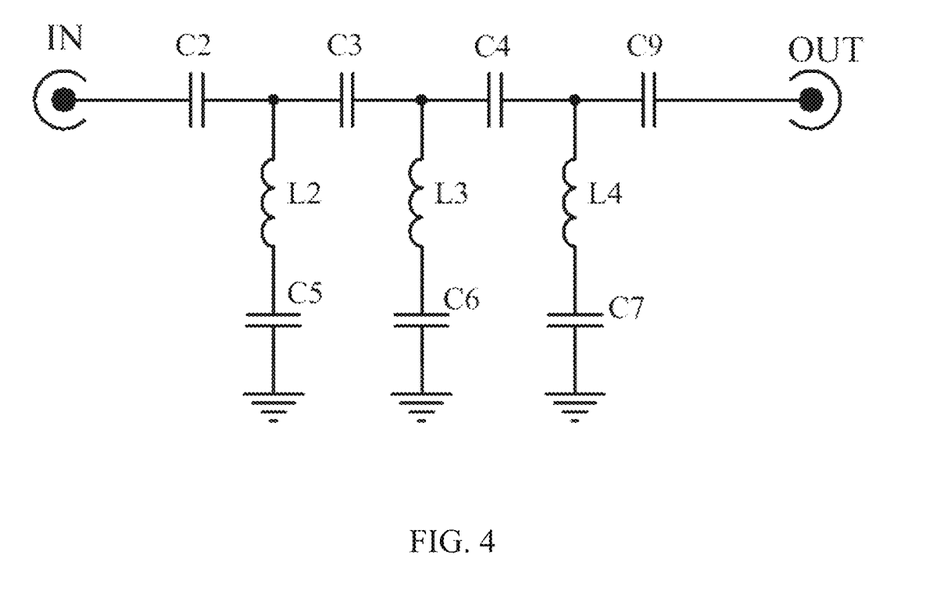
FIG. 4 is a circuit schematic diagram of a high-pass filtering module of a filtering circuit provided by embodiments of the present application.

FIG. 4 is a circuit schematic diagram of a high-pass filtering module of the filtering circuit provided in the embodiment of the present application. As shown in FIG. 4, the input signal is a terrestrial television signal, and the filtering circuit further includes a high-pass filtering module, an output end of the high-pass filtering module is connected to an input end of the switching module, the high-pass filtering module is configured to allow an ultra-high frequency signal, or a very-high frequency signal and an ultra-high frequency signal in the terrestrial television signal to be passed through.

In the embodiment of the present application, when the input signal is a terrestrial television signal, the high-pass filtering module is configured to let the UHF signal (Ultra High Frequency, UHF), or VHF signal (Very High. Frequency, VHF) and UHF signal pass through, that is because the terrestrial TV is usually above 470 MHz, which belongs the UHF signal.

The high-pass filtering module may include multiple sets of filter components connected in series and a fourth capacitor, the filter component includes a fourth inductor, a fifth capacitor and a sixth capacitor, one end of the fifth capacitor is an input end of the filter component, the other end of the fifth capacitor is connected to one end of the fourth capacitor, and the other end of the fifth capacitor is an output end of the filter component, the other end of the fourth capacitor is connected to the sixth capacitor in series and then connected to ground.

Specifically, in the embodiment of the present application, the high-pass filtering module 2 may include a capacitor C2, a capacitor C3, a capacitor C4, a capacitor C5, a capacitor C6, a capacitor C7, a capacitor C9 and an inductor L2, an inductor L3, and an inductor L4, and the input signals are connected to the capacitor C2, the capacitor C3, the capacitor C4, and the capacitor C9 in sequence, and the common connection of the capacitor C2 and the capacitor C3 is connected to one end of the inductor L2 and one end of the capacitor C5 in sequence, and the common connection of the capacitor C3 and the capacitor C4 is connected to one end of the inductor L3 and one end of the capacitor C6 in sequence, and the common connection of the capacitor C4 and the capacitor C9 is connected to one end of the inductor L4 and one end of the capacitor C7 in sequence, and the other end of the capacitor C5, the other end of the capacitor C6, and the other end of capacitor C7 are all connected to ground. Wherein, C9 is the fourth capacitor, (the capacitor C2, the inductor L2, the capacitor C5), (the capacitor C3, the inductor L3, the capacitor C6), (the capacitor C4, the inductor L4, the capacitor C7) are all filtering units 12.

In the embodiment of the present application, the high-pass filtering module 2 may be a band-pass filter or a band-rejection filter, which only allows the UHF signal or VHF signal and UHF signal to be passed through. For example, the high-pass filtering module 2 may only allow the terrestrial TV signal above 470 MHz to be passed through, that is means the frequency signal below 470 MHz is filtered, and the UHF signal retained. In the field of communication circuits, signals of 30-300 kHz are low frequency signals, signals of 300-3000 kHz are intermediate frequency signals, signals of 3-30 MHz are high frequency signals, frequencies ranged from 30-300 MHz are VHF signals, and frequencies ranged from 300-3000 MHz are UHF signals.

Figure 5:
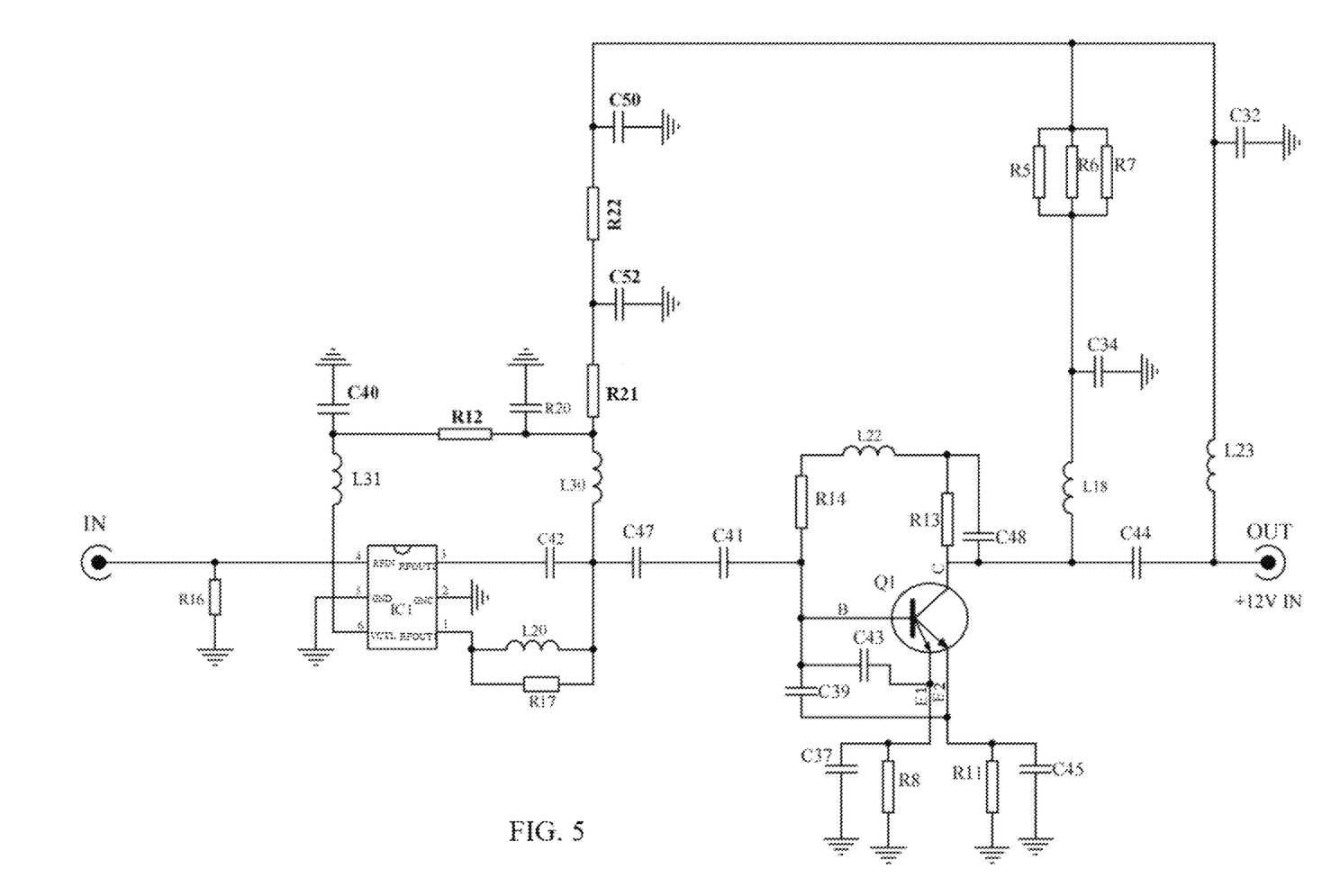
FIG. 5 is a circuit schematic diagram of an amplification module of a filtering circuit provided by embodiments of the present application.

FIG. 5 is a circuit schematic diagram of the amplification module of the filtering circuit provided in the embodiment of the present application. As shown in FIG. 5, the filtering circuit further includes an amplification module 3, the input end of the amplification module 3 is connected to the output end of the switching module 1, and the amplification module 3 is configured to amplify the singles filtered by the switching module 1. That is, the signals filtered by the filtering unit 12 are amplified through the amplification module 3, by which the product gain is improved and the reception effect is enhanced.

Exemplarily, in the embodiment of the present application, the amplification module 3 may include a chip IC1 and a triode Q1, the fourth pin of the chip IC1 is connected to the input signa, the fifth pin and the second pins of the chip IC1 are both connected to ground, and the sixth pin of the chip IC1 is connected to the thirty-first inductor L31 in series and then connected to one end of the fortieth capacitor C40 and one end of the twelfth resistor R12, and the other end of the twelfth resistor R12 is connected to one end of the twentieth capacitor C20, one end of the twenty-first resistor R21 and one end of the thirtieth inductor L30, and the other end of the thirtieth inductor L30 is connected to one end of the twentieth inductor L20 and one end of the seventeenth resistor R17, and the other end of the twentieth inductor L20 and the other end of the seventeenth resistor R17 are both connected to the first pin of the chip IC1; the other end of the twenty-first resistor R21 is connected to one end of the fifty-second capacitor C52 and one end of the twenty-second resistor R22, and the other end of the twenty-second resistor R22 is connected to one end of the fifty capacitor C50, one end of the fifth resistor R5, one end of the sixth resistor R6, one end of the seventh resistor R7, one end of the third-second capacitor C32 and one end of the twenty-third inductor L23, and the other end of the fortieth capacitor C40, the other end of the twentieth capacitor C20, the other end of the fifty-second capacitor C52, the other end of the fiftieth capacitor C50 and the other end of the thirty-second capacitor C32 are all connected to ground.

The third pin of the chip IC1 is successively connected to one end of the forty-second capacitor C42, one end of the forty-seventh capacitor C47 and one end of the forty-first capacitor C41 in series, and the other end of the forty-first capacitor C41 is connected to one end of the fourteenth resistor R14, the base of tire triode Q1, one end of the forty-third capacitor C43 and one end of the thirty-ninth capacitor C39, and the other end of the forty-third capacitor C43 is connected to the first emitter of the triode Q1, one end of the thirty-seventh capacitor C37 and one end of the eighth resistor R8, and the other end of the thirty-ninth capacitor C39 is connected to the second emitter of the triode Q1, one end of the eleventh resistor R11 and one end of the forty-fifth capacitor C45, and the collector of the triode Q1 is connected to one end of the thirteenth resistor R13, one end of the forty-eighth capacitor C48, one end of the eighteenth inductor L18 and one end of the forty-fourth capacitor C44, and the other end of the thirteenth resistor R13 and the other end of the forty-eighth capacitor C48 are both connected to one end of the twenty-second inductor L22, and the other end of the twenty-second inductor L22 is connected to the other end of the fourteenth resistor R14, and the other end of the eighteenth inductor L18 is connected to the other end of the fifth resistor R5, the other end of the sixth resistor R6, the other end of the seventh resistor R7 and one end of the third-fourth capacitor C34, and the other end of the forty-fourth capacitor C44 is connected to the output signal and the other end of the twenty-third inductor L23, and the other end of the thirty-seventh capacitor C37, the other end of the eighth resistor R8, the other end of the eleventh resistor R11, the other end of the forty-fifth capacitor C45 and the other end of the thirty-fourth capacitor C34 are all connected to ground.

The amplification module 3 amplifies the filtered weak signal and then transmits it to the television or other reception processing circuit. Meanwhile, zero to multi-stage amplification module 3 may be selected according to the strength of the local reception signal. The model of chip IC1 is NJG1152KA1, which is an RF amplified chip.

Figure 6:
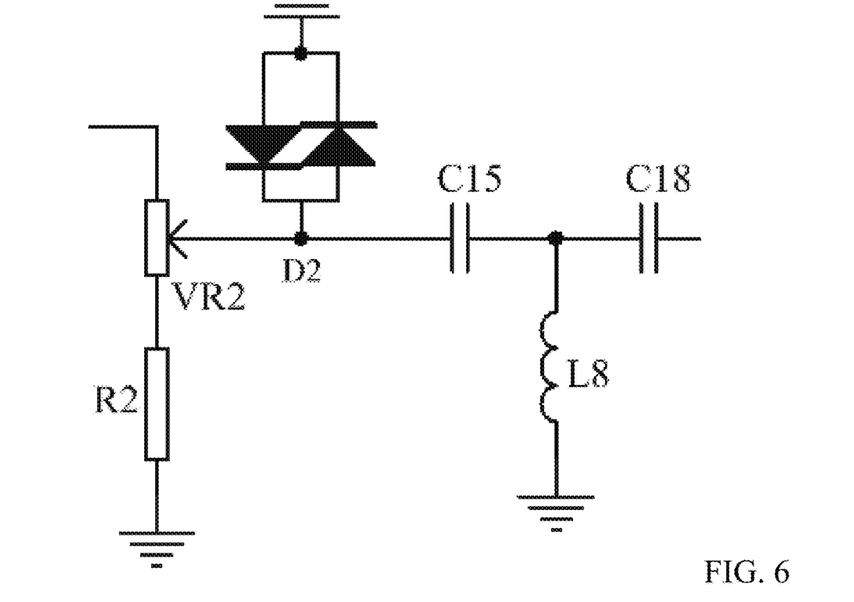
FIG. 6 is a circuit schematic diagram of a signal strength adjustment module of a filtering circuit provided by embodiments of the present application.

FIG. 6 is a circuit schematic diagram of the signal strength adjustment module of the filtering circuit provided in the embodiment of the present application. As shown in FIG. 6, the filtering circuit further includes a signal strength adjustment module 4, an output end of the signal strength adjustment module 4 is connected to an input end of the switching module 1, and the signal strength adjustment module is configured to adjust the strength of the input signal. The signal strength adjustment module 4 may include an adjustable resistor VR2 and a resistor R2, a fixed end of the adjustable resistor VR2 is connected to the resistor R2 in series and then connected to round, a sliding end of the adjustable resistor VR2 is connected to an input end of the switching module 1.

Exemplarily, in the embodiment of the present application, the signal strength adjustment module 4 may include an adjustable resistor VR2 and a second resistor R2, a first fixed end of the adjustable resistor VR2 is connected to the second resistor R2 in series and then connected to ground, and a second fixed end of the adjustable resistor VR2 is connected to the input signal, and a sliding end of the adjustable resistor VR2 is connected to one end of a freewheel diode D2 and one end of the fifteenth capacitor C15, and the other end of the fifteenth capacitor C15 is connected to one end of the eighteenth capacitor C18 and one end of the eighth inductor L8, and the other end of the eighth inductor L8 is connected to ground, and the other end of the eighteenth capacitor C18 is connected to the input end of the switching module 1.

The resistance is adjusted by the adjustable resistor VR2 to adjust the strength of the input signal, so that the strength of the input signal can be kept within a reasonable range. If the input signal is lower than the reasonable range, it will make the signal to noise ratio to be too poor, and the amplified signal will not be able to play; if the input sisal exceeds the reasonable range, it will saturate the amplification circuit and affect the playback effect. The main purpose of this embodiment is to prevent the input signal from exceeding a reasonable range.

Exemplarily, when the high-pass filtering module 2 and the signal strength adjustment module 4 are both provided at the same time, the high-pass filtering module 2 and the signal strength adjustment module 4 are connected in sequence, and the position can be interchangeable. Exemplarily, in the embodiment of the present application, the input end of the high-pass filtering module 2 is connected to the input signal, and the output end of the high-pass filtering module 2 is connected to the input end of the signal strength adjustment module 4, and the output end of the signal strength adjustment module 4 is connected to the input end of the switching module 1, and the output end of the switching module 1 is connected to the input end of the amplification module 3, and the output end of the amplification module outputs the final processed signal.

Figure 7:
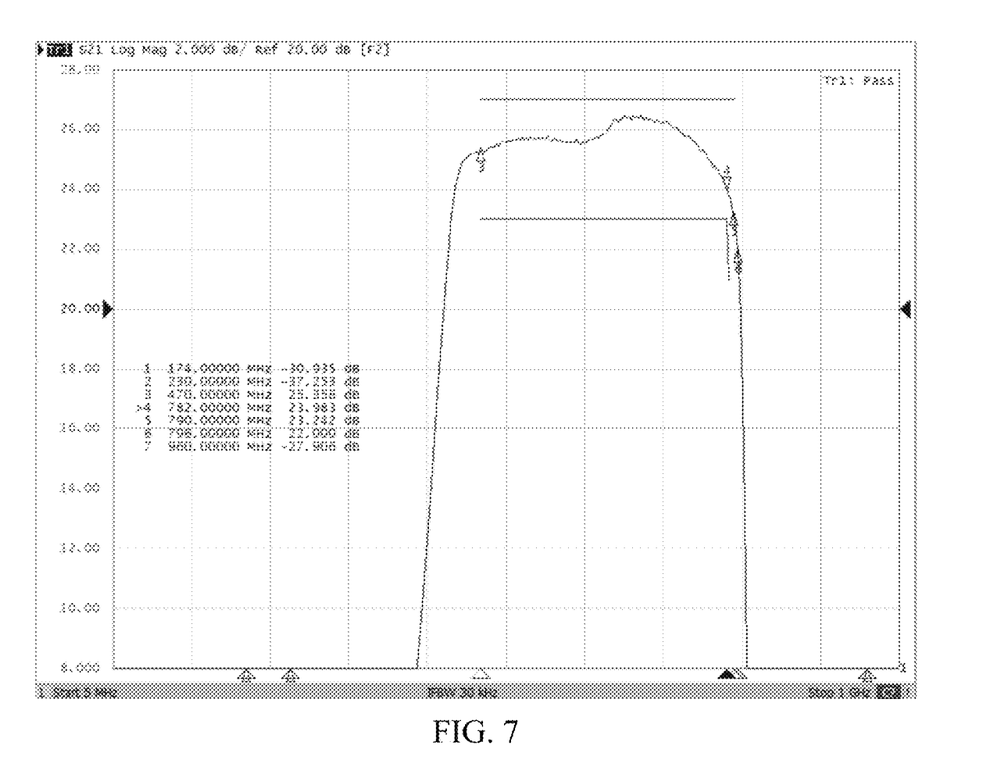
FIG. 7 is a signal waveform diagram when a 4G frequency is filtered by a filtering circuit provided by embodiments of the present application.

FIG. 7 is a signal waveform diagram when 4G frequency is filtered by the filtering circuit provided in the embodiment of the present application. As shown in FIG. 7, the product operating frequency is 470-782 MHz, and the gain is ±2 dB, wherein the curve is the test waveform, the horizontal line is the maximum value and the minimum value of gain, the median gain setting of this waveform is 25 dB. The amplifier parameters can be adjusted according to different gain values, such as 10 dB, 12 dB, 15 dB, 20 dB and 30 dB, etc.

Figure 8:
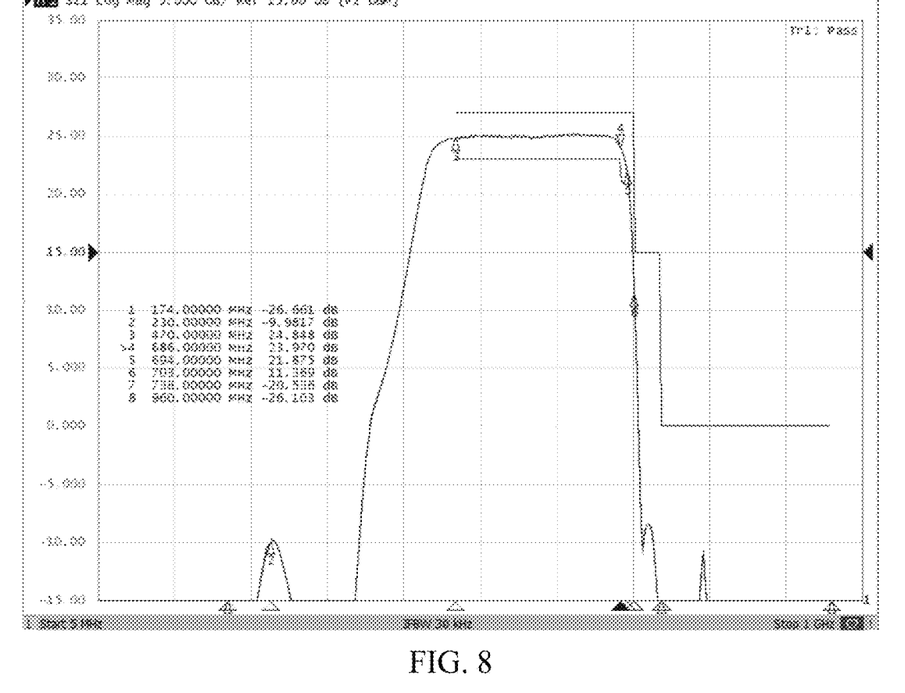

FIG. 8 is a signal waveform diagram when 5G frequency is filtered by the filtering circuit provided in the embodiment of the present application. As shown in FIG. 8, the product operating frequency is 470-694 MHz, and the gain is ±2 dB, wherein the curve is the test waveform, the horizontal line is the maximum value and the minimum value of gain, the median gain setting of this waveform is 25 dB. The amplifier parameters can be adjusted according to different gain values, such as 10 dB, 12 dB, 15 dB, 20 dB, 30 dB, etc.

Figure 9:
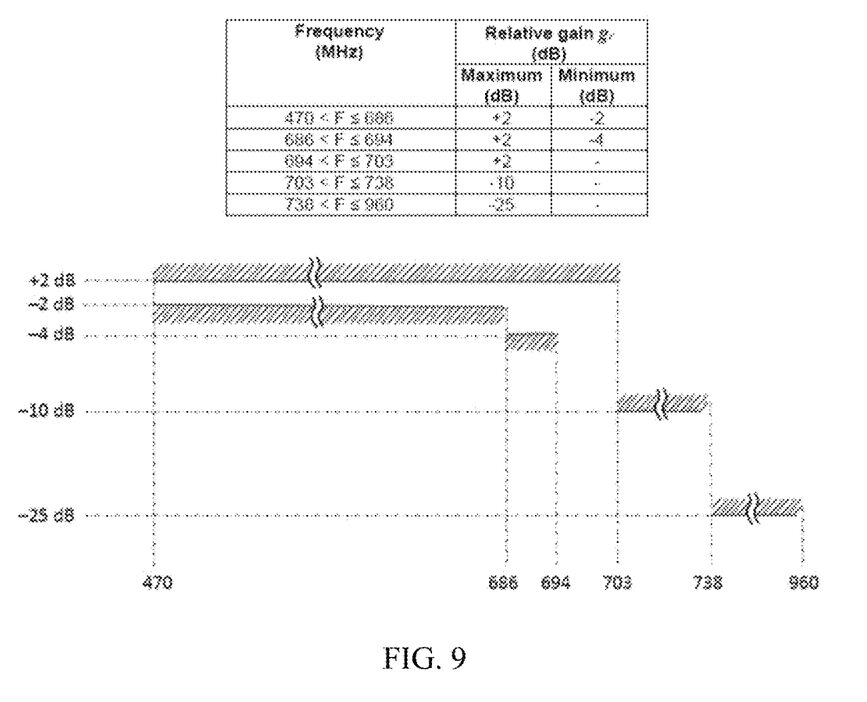
FIG. 9 is a European certification standard diagram of a frequency signal gain value of a filtering circuit provided by embodiments of the present application.

FIG. 9 is a European certification standard diagram of the frequency signal gain value of the filtering circuit provided in the embodiment of the present application. As shown in FIG. 9, the maximum value and the minimum value of the operating frequency gain in the embodiment of the present application are set in accordance with the certification standard of the European export.

In a second aspect, the embodiment of the present application provides a TV antenna amplifier, which includes the aforesaid filtering circuit.

In the embodiment of the present application, the filtering circuit of the present application is applied to the TV antenna amplifier of the TV so as to avoid mutual interference between the terrestrial television signal and the mobile communication signal of the mobile phone, improve the actual reception effect of the TV, and consider the filtering requirements of different regional frequency signals, which can be sold in multiple regions, and the user can implement the upgrade and switch of 4G to 5G by themselves, which has a wide range of applications.

It can be understood that the numbers of all the steps in aforesaid embodiments do not necessarily stand for their implementation order, and the implementation order of each process should be determined by its function and inner logic, thus the sequence indicated by the numbers of all the steps is not intended to limit an implementation process of the embodiments of the present application.

It can be clearly understood by the one of ordinary skill in the art that, for describing conveniently and concisely, dividing of the aforesaid various functional units, functional modules is described exemplarily merely, in an actual application, the aforesaid functions can be assigned to different functional units and functional modules to be accomplished, that is, an inner structure of a data synchronizing device is divided into functional units or modules so as to accomplish the whole or a part of functionality described above. The various functional units, modules in the embodiments can be integrated into a processing unit, or each of the units exists independently and physically, or two or more than two of the units are integrated into a single unit. The aforesaid integrated unit can be either actualized in the form of hardware or in the form of software functional units. In addition, specific names of the various functional units and modules are only used for distinguishing from each other conveniently, but not intended to limit the protection scope of the present application. Regarding a specific working process of the units and modules in the aforesaid device, reference can be made to a corresponding process in the aforesaid method embodiments, it is not repeatedly described herein.

In the aforesaid embodiments, the descriptions of each of the embodiments are emphasized respectively, regarding the part of one embodiment which isn't described or disclosed in detail, reference may be made to relevant descriptions in some other embodiments.

The person of ordinary skill in the art may be aware of that, the elements and algorithm steps of each of the examples described in connection with the embodiments disclosed herein may be implemented in electronic hardware, or in combination with computer software and electronic hardware. Whether these functions are implemented by hardware or software depends on the specific application and design constraints of the technical solution. The skilled people could use different methods to implement the described functions for each particular application, however, such implementations should not be considered as going beyond the scope of the present application.

It should be understood that, in the embodiments of the present application, the disclosed filtering circuit and method could be implemented in other ways. For example, the device described above are merely illustrative, for example, the division of the units is only a logical function division, and other division could be used in the actual implementation, for example, multiple units or components could be combined or integrated into another system, or some features may be ignored or not performed. In another aspect, the coupling or direct coupling or communicating connection shown or discussed could be an indirect coupling or a communicating connection through some interfaces, devices or units, and the coupling or direct coupling or communicating connection could be electrical, mechanical, or in other form.

The units described as separate components could or could not be physically separate, the components shown as units could or could not be physical units, which may be located in one place, or may be distributed to multiple network elements. A part or a whole of the elements could be selected according to the actual needs to achieve the objective of the present embodiment.

In addition, the various functional units in each of the embodiments of the present application may be integrated into a single processing unit, or exist individually and physically, or two or more than two units are integrated into a single unit. The aforesaid integrated unit may either be achieved by hardware, or be achieved in the form of software functional units.

The above-mentioned embodiments of the present application are merely used to describe rather than limit the technical solutions of the present application. Although the present application is described in detail according to the above-mentioned embodiments of the present application, those skilled in the art should understand that the technical solutions recited in respective above-mentioned embodiments of the present application can be modified or parts of technical features in the technical solutions can be substituted by technically equivalent elements. The modifications or substitutions without departing from the spirit and the scope of the technical solutions of the embodiments of the present application all fall within the scope of protection of the present application.

What is claimed is:

1. A filtering circuit, comprising:
   a switching module, comprising a control unit and at least two filtering units;
   wherein the at least two filtering units are configured to filter signals of different frequencies in an input signal respectively;
   wherein the control unit is configured to switchably render one of the at least two filtering units conductive, and the remaining filtering unit non-conductive,
   wherein the filtering unit comprises a first capacitor and a first inductor, at least one resonance unit and a second inductor, the first inductor, the at least one resonance unit and the second inductor being connected in series; one end of the first capacitor is connected to one end of the resonance unit, the other end of the first capacitor is connected to ground.

2. The filtering circuit of claim 1, wherein the at least two filtering units are connected in parallel, the control unit comprises a switch and a PIN diode, the switch is configured to switch a power to connect to one of the at least two filtering units, and an input end and an output end of each filtering unit are connected to a positive pole of one PIN diode respectively.

3. The filtering circuit of claim 1, wherein the resonance unit comprises a third inductor, a second capacitor and a third capacitor; the third inductor and the second capacitor are connected in parallel, one end of the third capacitor is connected to one end of the second capacitor, the other end of the third capacitor is connected to ground.

4. The filtering circuit of claim 1, wherein the at least two filtering units comprise a 4G filtering unit and a 5G filtering unit; the 4G filtering unit is configured to filter the 4G mobile communication signal in the input signal; the 5G filtering unit is configured to filter the 5G mobile communication signal in the input signal; the control unit is configured to switchably render the 4G filtering unit or the 5G filtering unit conductive;
   the input signal is a terrestrial television signal, and the filtering circuit further comprises a high-pass filtering module; an output end of the high-pass filtering module is connected to an input end of the switching module, the high-pass filtering module is configured to allow an ultra-high frequency signal, or a very-high frequency signal and an ultra-high frequency signal in the terrestrial television signal to be passed through.

5. The filtering circuit of claim 4, wherein the high-pass filtering module comprises multiple sets of filter components connected in series and a fourth capacitor; the filter component comprises a fourth inductor, a fifth capacitor and a sixth capacitor; one end of the fifth capacitor is an input end of the filter component, the other end of the fifth capacitor is connected to one end of the fourth capacitor, and the other end of the fifth capacitor is an output end of the filter component, the other end of the fourth capacitor is connected to the sixth capacitor in series and then connected to ground.

6. The filtering circuit of claim 1, wherein the filtering circuit further comprises an amplification module; an input end of the amplification module is connected to an output end of the switching module, and the amplification module is configured to amplify the singles filtered by the switching module.

7. The filtering circuit of claim 1, wherein the filtering circuit further comprises a signal strength adjustment module; an output end of the signal strength adjustment module is connected to an input end of the switching module, and the signal strength adjustment module is configured to adjust strength of the input signal.

8. The filtering circuit of claim 7, wherein the signal strength adjustment module comprises an adjustable resistor and a resistor; a fixed end of the adjustable resistor is connected to the resistor in series and then connected to ground, a sliding end of the adjustable resistor is connected to an input end of the switching module.

9. A TV antenna amplifier, comprising a filtering circuit, wherein the filtering circuit comprising:
   a switching module, comprising a control unit and at least two filtering units;
   wherein the at least two filtering units are configured to filter signals of different frequencies in an input signal respectively;
   wherein the control unit is configured to switchably render one of the at least two filtering units conductive, and the remaining filtering unit non-conductive,
   wherein the filtering unit comprises a first capacitor and a first inductor, at least one resonance unit and a second inductor, the first inductor, the at least one resonance unit and the second inductor being connected in series; one end of the first capacitor is connected to one end of the resonance unit, the other end of the first capacitor is connected to ground.

10. The TV antenna amplifier according to claim 9, wherein the at least two filtering units are connected in parallel, the control unit comprises a switch and a PIN diode, the switch is configured to switch a power to connect to one of the at least two filtering units, and an input end and an output end of each filtering unit are connected to a positive pole of one PIN diode respectively.

11. The TV antenna amplifier according to claim 9, wherein the resonance unit comprises a third inductor, a second capacitor and a third capacitor; the third inductor and the second capacitor are connected in parallel, one end of the third capacitor is connected to one end of the second capacitor, the other end of the third capacitor is connected to ground.

12. The TV antenna amplifier according to claim 9, wherein the at least two filtering units comprise a 4G filtering unit and a 5G filtering unit; the 4G filtering unit is configured to filter the 4G mobile communication signal in the input signal; the 5G filtering unit is configured to filter the 5G mobile communication signal in the input signal; the control unit is configured to switchably render the 4G filtering unit or the 5G filtering unit conductive;
the input signal is a terrestrial television signal, and the filtering circuit further comprises a high-pass filtering module; an output end of the high-pass filtering module is connected to an input end of the switching module, the high-pass filtering module is configured to allow an ultra-high frequency signal, or a very-high frequency signal and an ultra-high frequency signal in the terrestrial television signal to be passed through.

13. The TV antenna amplifier according to claim 12, wherein the high-pass filtering module comprises multiple sets of filter components connected in series and a fourth capacitor;
the filter component comprises a fourth inductor, a fifth capacitor and a sixth capacitor; one end of the fifth capacitor is an input end of the filter component, the other end of the fifth capacitor is connected to one end of the fourth capacitor, and the other end of the fifth capacitor is an output end of the filter component, the other end of the fourth capacitor is connected to the sixth capacitor in series and then connected to ground.

14. The TV antenna amplifier according to claim 9, wherein the filtering circuit further comprises an amplification module; an input end of the amplification module is connected to an output end of the switching module, and the amplification module is configured to amplify the singles filtered by the switching module.

15. The TV antenna amplifier according to claim 9, wherein the filtering circuit further comprises a signal strength adjustment module; an output end of the signal strength adjustment module is connected to an input end of the switching module, and the signal strength adjustment module is configured to adjust strength of the input signal.

16. The TV antenna amplifier according to claim 15, wherein the signal strength adjustment module comprises an adjustable resistor and a resistor; a fixed end of the adjustable resistor is connected to the resistor in series and then connected to ground, a sliding end of the adjustable resistor is connected to an input end of the switching module.

17. A filtering circuit, comprising:
a switching module, comprising a control unit and at least two filtering units;
wherein the at least two filtering units are configured to filter signals of different frequencies in an input signal respectively;
wherein the control unit is configured to switchably render one of the at least two filtering units conductive, and the remaining filtering unit non-conductive; and
wherein the at least two filtering units are connected in parallel, the control unit comprises a switch and a PIN diode, the switch is configured to switch a power to connect to one of the at least two filtering units, and an input end and an output end of each filtering unit are connected to a positive pole of one PIN diode respectively.

* * * * *